US011237726B2

United States Patent
Fitzpatrick et al.

(10) Patent No.: US 11,237,726 B2
(45) Date of Patent: Feb. 1, 2022

(54) MEMORY SYSTEM PERFORMANCE ENHANCEMENTS USING MEASURED SIGNAL AND NOISE CHARACTERISTICS OF MEMORY CELLS

(71) Applicant: Micron Technology, Inc., Boise, ID (US)

(72) Inventors: James Fitzpatrick, Laguna Niguel, CA (US); Sivagnanam Parthasarathy, Carlsbad, CA (US); Patrick Robert Khayat, San Diego, CA (US); AbdelHakim S. Alhussien, San Jose, CA (US); Violante Moschiano, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/714,463

(22) Filed: Dec. 13, 2019

(65) Prior Publication Data

US 2021/0181942 A1 Jun. 17, 2021

(51) Int. Cl.
*G06F 3/06* (2006.01)
*G11C 16/26* (2006.01)
*G11C 16/04* (2006.01)
*G11C 11/56* (2006.01)

(52) U.S. Cl.
CPC .......... *G06F 3/0604* (2013.01); *G06F 3/0644* (2013.01); *G06F 3/0673* (2013.01); *G11C 16/26* (2013.01); *G11C 11/5642* (2013.01); *G11C 11/5671* (2013.01); *G11C 16/0483* (2013.01)

(58) Field of Classification Search
CPC .... G06F 3/0604; G06F 3/0644; G06F 3/0673; G11C 16/26; G11C 16/0483; G11C 11/5642; G11C 11/5671
USPC ........................................................ 711/103
See application file for complete search history.

(56) References Cited

U.S. PATENT DOCUMENTS

| 5,864,504 A * | 1/1999 | Tanzawa .................. G11C 7/04 365/185.24 |
| 2008/0002468 A1 | 1/2008 | Hemink |
| 2008/0056008 A1 | 3/2008 | Aritome et al. |
| 2008/0192544 A1 | 8/2008 | Berman et al. |
| 2014/0022853 A1 | 1/2014 | Choi et al. |

(Continued)

OTHER PUBLICATIONS

International Search Report and Written Opinion, PCT/US2020/063788, dated Mar. 26, 2021.

*Primary Examiner* — Fernando Hidalgo
(74) *Attorney, Agent, or Firm* — Greenberg Traurig (57) ABSTRACT

A memory sub-system configured to improve performance using signal and noise characteristics of memory cells measured during the execution of a command in a memory component. For example, the memory component is enclosed in an integrated circuit and has a calibration circuit. The signal and noise characteristics are measured by the calibration circuit as a byproduct of executing the command in the memory component. A processing device separate from the memory component transmits the command to the memory component, and receives and processes the signal and noise characteristics to identify an attribute about the memory component. Subsequently, an operation related to data stored in the memory component can be performed based on the attribute.

20 Claims, 6 Drawing Sheets

(56) References Cited

U.S. PATENT DOCUMENTS

2014/0068384 A1    3/2014   Kwak et al.
2019/0043590 A1*   2/2019   Besinga .................. G11C 29/42

* cited by examiner

MEMORY SYSTEM PERFORMANCE ENHANCEMENTS USING MEASURED SIGNAL AND NOISE CHARACTERISTICS OF MEMORY CELLS

FIELD OF THE TECHNOLOGY

At least some embodiments disclosed herein relate to memory systems in general, and more particularly, but not limited to memory systems having enhanced performance implemented using signal and noise characteristics measured for memory cells in the memory systems.

BACKGROUND

A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The embodiments are illustrated by way of example and not limitation in the figures of the accompanying drawings in which like references indicate similar elements.

DETAILED DESCRIPTION

At least some aspects of the present disclosure are directed to a memory sub-system having performance enhanced through using signal and noise characteristics measured for memory cells in integrated circuit (IC) memory of memory sub-systems. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices that store data. The host system can provide data to be stored at the memory sub-system and can request data to be retrieved from the memory sub-system.

An integrated circuit memory cell (e.g., a flash memory cell) can be programmed to store data by the way of its state at a threshold voltage. For example, if the memory cell is configured/programmed in a state that allows a substantial current to pass the memory cell at the threshold voltage, the memory cell is storing a bit of one; and otherwise, the memory cell is storing a bit of zero. Further, a memory cell can store multiple bits of data by being configured/programmed differently at multiple threshold voltages. For example, the memory cell can store multiple bits of data by having a combination of states at the multiple threshold voltages; and different combinations of the states of the memory cell at the threshold voltages can be interpreted to represent different states of bits of data that is stored in the memory cell.

However, after the states of integrated circuit memory cells are configured/programmed using write operations to store data in the memory cells, the optimized threshold voltage for reading the memory cells can shift due to a number of factors, such as charge loss, read disturb, cross-temperature effect (e.g., write and read at different operating temperatures), etc., especially when a memory cell is programmed to store multiple bits of data.

Conventional calibration circuitry has been used to self-calibrate a memory region in applying read level signals to account for shift of threshold voltages of memory cells within the memory region. During the calibration, the calibration circuitry is configured to apply different test signals to the memory region to count the numbers of memory cells that output a specified data state for the test signals. Based on the counts, the calibration circuitry determines a read level offset value as a response to a calibration command.

At least some aspects of the present disclosure address the above and other deficiencies by a controller of a memory sub-system using signal and noise characteristics measured by a memory device for memory cells in the memory device. Preferably, the memory device measures the signal and noise characteristics during regular read operations. The signal and noise characteristics can be used by the controller to determine optimized control parameters for memory operations in the memory device, to evaluate the accuracy of the data reported by the memory device in a read operation, to detect errors in the data reported by the memory device, to post-processing the data reported by the memory device for enhanced accuracy, to improve sequences of operations of the memory device for improved data reliability and accuracy and for reduced latency, etc.

For example, counts measured by calibration circuitry and/or its associated data can be used as signal and noise characteristics in the controller of a memory sub-system to improve its operations. Further, such signal and noise characteristics can be measured for sub-regions in parallel to reduce the total time for measuring the signal and noise characteristics.

Figure 1:
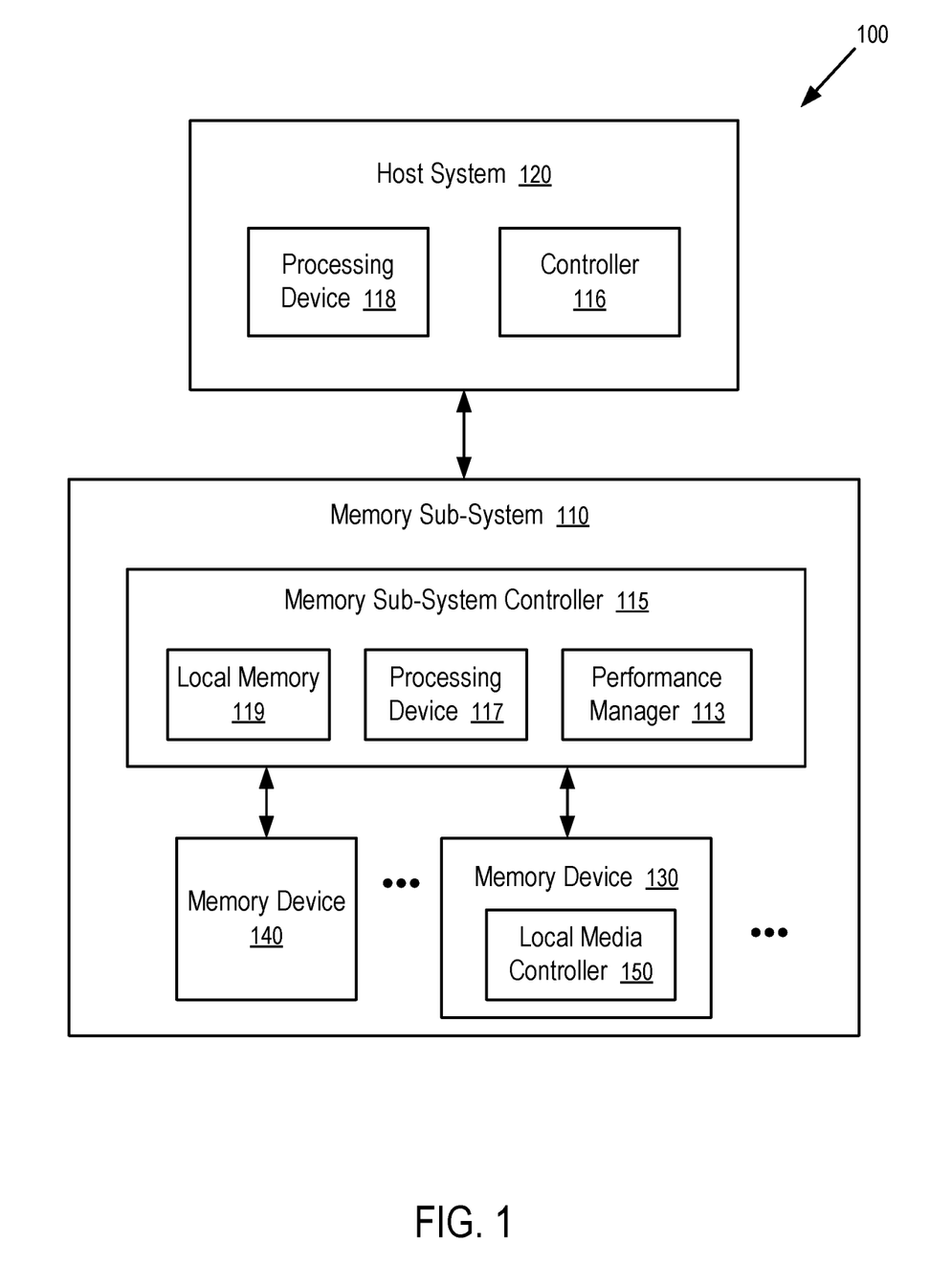
FIG. 1 illustrates an example computing system having a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO- DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 130, 140. The controller 116 can further include interface circuitry to communicate with the memory sub-system 110. The interface circuitry can convert responses received from memory sub-system 110 into information for the host system 120.

The controller 116 of the host system 120 can communicate with controller 115 of the memory sub-system 110 to perform operations such as reading data, writing data, or erasing data at the memory devices 130, 140 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 130, 140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory components include a negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (i.e., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 150 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 150) for media management within the same memory device package. An example of a managed memory device is a managed NAND (MNAND) device.

The controller 115 can include a performance manager 113 that can enhance the performance of the memory sub-system 110 using signal and noise characteristics measured by the memory devices 130 for memory cells in the respective memory devices 130. In some embodiments, the controller 115 in the memory sub-system 110 includes at least a portion of the performance manager 113. In other embodiments, or in combination, the controller 116 and/or the processing device 118 in the host system 120 includes at least a portion of the performance manager 113. For example, the controller 115, the controller 116, and/or the processing device 118 can include logic circuitry implementing the performance manager 113. For example, the controller 115, or the processing device 118 (processor) of the host system 120, can be configured to execute instructions stored in memory for performing the operations of the performance manager 113 described herein. In some embodiments, the performance manager 113 is implemented in an integrated circuit chip disposed in the memory sub-system 110. In other embodiments, the performance manager 113 can be part of firmware of the memory sub-system 110, an operating system of the host system 120, a device driver, or an application, or any combination therein.

The performance manager 113 can receive signal and noise characteristics measured and provided by a memory device 130 for the memory cells in the memory device 130 and process the signal and noise characteristics to generate parameters for improved operations of the memory device 130, to detect and/or correct errors in data retrieved and reported by the memory device 130 from its memory cells, and/or to schedule operations for improved data accuracy and reliability, as further discussed below.

Figure 2:
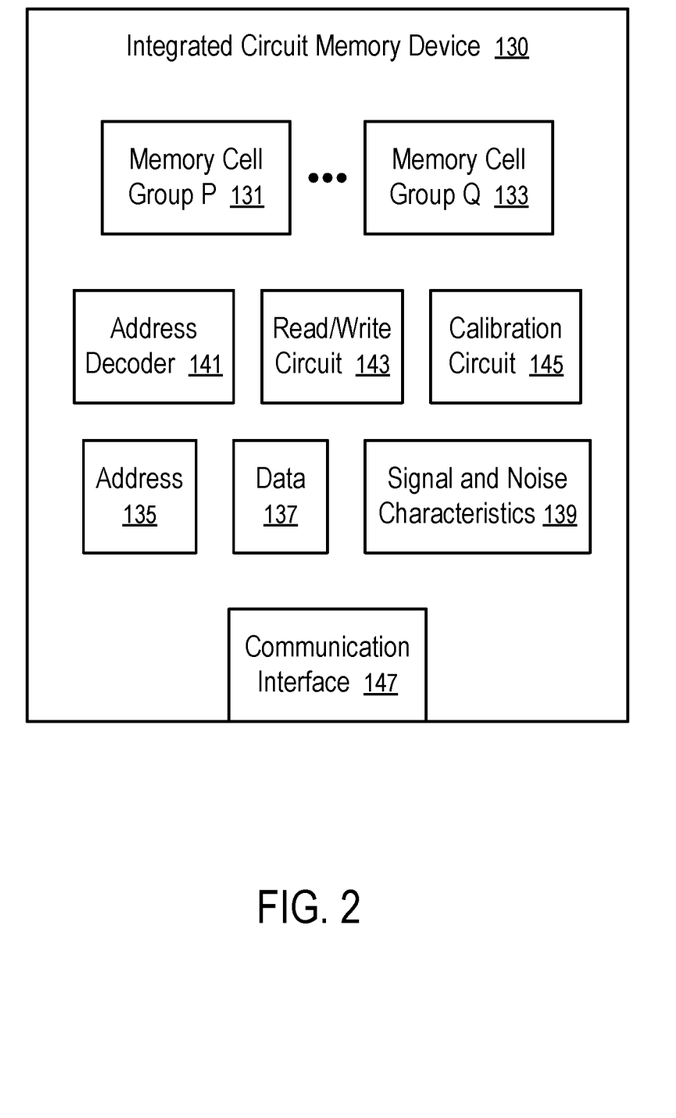
FIG. 2 illustrates an integrated circuit memory device having a calibration circuit configured to measure signal and noise characteristics according to one embodiment.

FIG. 2 illustrates an integrated circuit memory device 130 having a calibration circuit 145 configured to measure signal and noise characteristics according to one embodiment. For example, the memory devices 130 in the memory sub-system 110 of FIG. 1 can be implemented using the integrated circuit memory device 130 of FIG. 2.

The integrated circuit memory device 130 can be enclosed in a single integrated circuit package. The integrated circuit memory device 130 includes multiple groups 131, . . . , 133 of memory cells that can be formed in one or more integrated circuit dies. A typical memory cell in a group 131, . . . , 133 can be programmed to store one or more bits of data.

Some of the memory cells in the integrated circuit memory device 130 can be configured to be operated together for a particular type of operations. For example, memory cells on an integrated circuit die can be organized in planes, blocks, and pages. A plane contains multiple blocks; a block contains multiple pages; and a page can have multiple strings of memory cells. For example, an integrated circuit die can be the smallest unit that can independently execute commands or report status; identical, concurrent operations can be executed in parallel on multiple planes in an integrated circuit die; a block can be the smallest unit to perform an erase operation; and a page can be the smallest unit to perform a data program operation (to write data into memory cells). Each string has its memory cells connected to a common bitline; and the control gates of the memory cells at the same positions in the strings in a block or page are connected to a common wordline. Control signals can be applied to wordlines and bitlines to address the individual memory cells.

The integrated circuit memory device 130 has a communication interface 147 to receive an address 135 from the controller 115 of a memory sub-system 110 and to provide the data 137 retrieved from the memory address 135. An address decoder 141 of the integrated circuit memory device 130 converts the address 135 into control signals to select the memory cells in the integrated circuit memory device 130; and a read/write circuit 143 of the integrated circuit memory device 130 performs operations to determine data stored in the addressed memory cells or to program the memory cells to have states corresponding to storing the data 137.

The integrated circuit memory device 130 has a calibration circuit 145 configured to determine measurements of signal and noise characteristics 139 of memory cells in a group (e.g., 131, . . . , or 133) and provide the signal and noise characteristics 139 to the controller 115 of a memory sub-system 110 via the communication interface 147.

In at least some embodiments, the calibration circuit 145 also provides, to the controller 115 via the communication interface 147, the signal and noise characteristics 139 measured to determine the read level offset value. In some embodiments, the read level offset value can be used to understand, quantify, or estimate the signal and noise characteristics 139. In other embodiments, the statistics of memory cells in a group or region that has a particular state at one or more test voltages can be provided as the signal and noise characteristics 139.

For example, the calibration circuit 145 can measure the signal and noise characteristics 139 by reading different responses from the memory cells in a group (e.g., 131, . . . , 133) by varying operating parameters used to read the memory cells, such as the voltage(s) applied during an operation to read data from memory cells.

For example, the calibration circuit 145 can measure the signal and noise characteristics 139 on the fly when executing a command to read the data 137 from the address 135. Since the signal and noise characteristics 139 is measured as part of the operation to read the data 137 from the address 135, the signal and noise characteristics 139 can be provided from the integrated circuit memory device 130 to the controller 115 with reduced or no penalty on the latency in the execution of the command to read the data 137 from the address 135.

The performance manager 113 of the controller 115 of the memory sub-system 110 is configured to use the signal and noise characteristics 139 to enhance the performance of the memory sub-system 110.

For example, the performance manager 113 can use the signal and noise characteristics 139 of a group of memory cells under different conditions to generate a model for determining optimized parameters to read data from the group of memory cells under various conditions.

For example, the performance manager 113 can use the signal and noise characteristics 139 of different groups of memory cells to generate a model of memory cells in the memory device 130 in predicting the behavior of memory cell groups.

Figure 3:
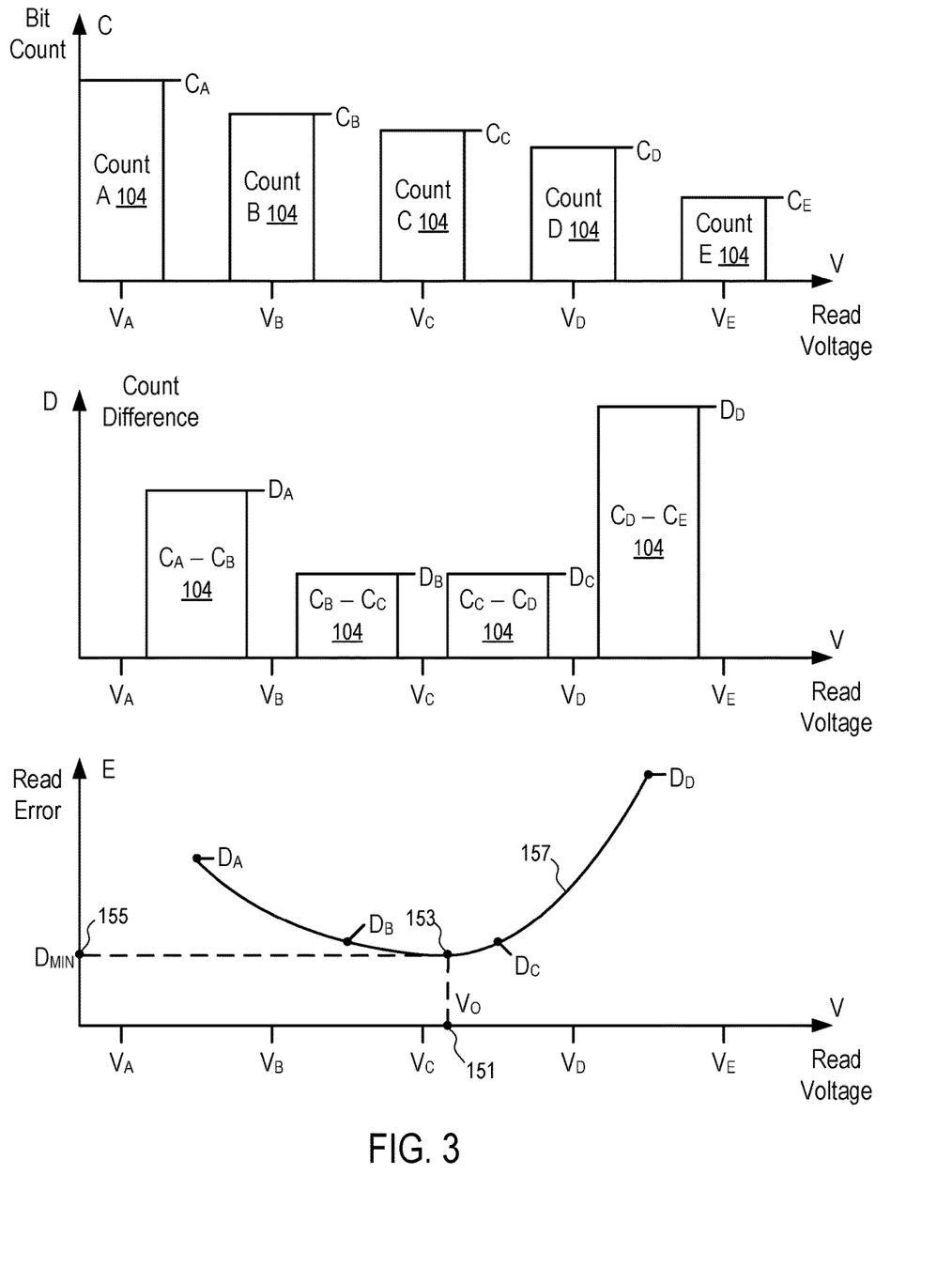
FIG. 3 shows an example of measuring signal and noise characteristics to improve memory read operations according to one embodiment.

FIG. 3 shows an example of measuring signal and noise characteristics 139 to improve memory read operations according to one embodiment.

In FIG. 3, the calibration circuit 145 applies different read voltages $V_A$, $V_B$, $V_C$, $V_D$, and $V_E$ to read the states of memory cells in a group (e.g., 131, . . . , or 133). In general, more or less read voltages can be used to generate the signal and noise characteristics 139.

As a result of the different voltages applied during the read operation, a same memory cell in the group (e.g., 131, . . . , or 133) may show different states. Thus, the counts $C_A$, $C_B$, $C_C$, $C_D$, and $C_E$ of memory cells having a predetermined state at different read voltages $V_A$, $V_B$, $V_C$, $V_D$, and $V_E$ can be different in general. The predetermined state can be a state of having substantial current passing through the memory cells, or a state of having no substantial current passing through the memory cells. The counts $C_A$, $C_B$, $C_C$, $C_D$, and $C_E$ can be referred to as bit counts.

The calibration circuit 145 can measure the bit counts by applying the read voltages $V_A$, $V_B$, $V_C$, $V_D$, and $V_E$ one at a time on the group (e.g., 131, . . . , or 133) of memory cells.

Alternatively, the group (e.g., 131, . . . , or 133) of memory cells can be configured as multiple subgroups; and the calibration circuit 145 can measure the bit counts of the subgroups in parallel by applying the read voltages $V_A$, $V_B$, $V_C$, $V_D$, and $V_E$. The bit counts of the subgroups are considered as representative of the bit counts in the entire group (e.g., 131, . . . , or 133). Thus, the time duration of obtaining the counts $C_A$, $C_B$, $C_C$, $C_D$, and $C_E$ can be reduced.

In some embodiments, the bit counts $C_A$, $C_B$, $C_C$, $C_D$, and $C_E$ are measured during the execution of a command to read the data 137 from the address 135 that is mapped to one or more memory cells in the group (e.g., 131, . . . , or 133). Thus, the controller 115 does not need to send a separate command to request for the signal and noise characteristics 139 that is based on the bit counts $C_A$, $C_B$, $C_C$, $C_D$, and $C_E$.

The differences between the bit counts of the adjacent voltages are indicative of the errors in reading the states of the memory cells in the group (e.g., 133, . . . , or 133).

For example, the count difference $D_A$ is calculated from $C_A$–$C_B$, which is an indication of read error introduced by changing the read voltage from $V_A$ to $V_B$.

Similarly, $D_B = C_B - C_C$; $D_C = C_C - C_D$; and $D_D = C_D - C_E$.

The curve 157, obtained based on the count differences $D_A$, $D_B$, $D_C$, and $D_D$, represents the prediction of read error E as a function of the read voltage. From the curve 157 (and/or the count differences), the optimized read voltage $V_O$ can be calculated as the point 153 that provides the lowest read error $D_{MIN}$ on the curve 157.

In one embodiment, the calibration circuit 145 computes the optimized read voltage $V_O$ and causes the read/write circuit 143 to read the data 137 from the address 135 using the optimized read voltage $V_O$.

Alternatively, the calibration circuit 145 can provide, via the communication interface 147 to the controller 115 of the memory sub-system 110, the count differences $D_A$, $D_B$, $D_C$, and $D_D$ and/or the optimized read voltage $V_O$ calculated by the calibration circuit 145.

FIG. 3 illustrates an example of generating a set of statistical data (e.g., bit counts and/or count differences) for reading at an optimized read voltage $V_O$. In general, a group of memory cells can be configured to store more than one bit in a memory cell; and multiple read voltages are used to read the data stored in the memory cells. A set of statistical data can be similarly measured for each of the read voltages to identify the corresponding optimize read voltage, where the test voltages in each set of statistical data are configured in the vicinity of the expected location of the corresponding optimized read voltage. Thus, the signal and noise characteristics 139 measured for a memory cell group (e.g., 131 or 133) can include multiple sets of statistical data measured for the multiple threshold voltages respectively.

Figure 4:
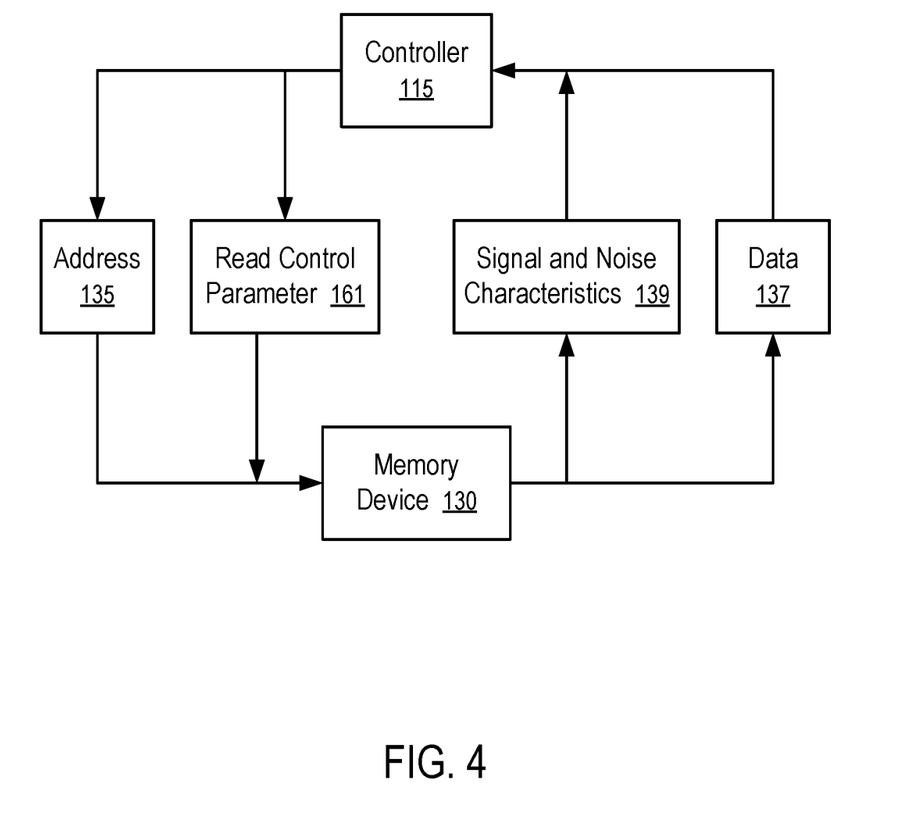
FIG. 4 illustrates a controller of a memory sub-system obtaining signal and noise characteristics from a memory device for enhanced operations of the memory device according to one embodiment.

FIG. 4 illustrates a controller 115 of a memory sub-system 110 obtaining signal and noise characteristics 139 from a memory device 130 for enhanced operations of the memory device 130 according to one embodiment. For example, the memory device 130 in FIG. 4 can be implemented using the integrated circuit memory device 130 of FIG. 2; and interactions between the controller 115 and the memory devices 130 can be implemented according to FIG. 4.

In FIG. 4, the controller 115 can instruct the memory device 130 to perform a read operation by providing an address 135 and at least one read control parameter 161. For example, the read control parameter 161 can be a suggested read voltage.

The memory device 130 can perform the read operation by determining the states of memory cells at the address 135 at a read voltage and provide the data 137 according to the determined states.

During the read operation, the calibration circuit 145 of the memory device 130 generates the signal and noise characteristics 139. The data 137 and the signal and noise characteristics 139 are provided from the memory device 130 to the controller 115 as a response. Alternatively, the processing of the signal and noise characteristics 139 can be performed at least in part using logic circuitry configured in the memory device 130. For example, the performance manager 113 can be implemented partially or entirely using the processing logic configured in the memory device 130.

The signal and noise characteristics 139 can be determined based at least in part on the read control parameter 161. For example, when the read control parameter 161 is a suggested read voltage for reading the memory cells at the address 135, the calibration circuit 145 can compute the read voltages $V_A$, $V_B$, $V_C$, $V_D$, and $V_E$ that are in the vicinity of the suggested read voltage.

The signal and noise characteristics 139 can include the bit counts $C_A$, $C_B$, $C_C$, $C_D$, and $C_E$. Alternatively, or in combination, the signal and noise characteristics 139 can include the count differences $D_A$, $D_B$, $D_C$, $D_D$, and $D_E$.

Optionally, the calibration circuit 145 uses one method to compute an optimized read voltage $V_O$ from the count differences $D_A$, $D_B$, $D_C$, $D_D$, and $D_E$; and the performance manager 113 of the controller 115 uses another different method to compute the optimized read voltage $V_O$ from the signal and noise characteristics 139 and optionally other data that is not available to the calibration circuit 145.

When the calibration circuit 145 can compute the optimized read voltage $V_O$ from the count differences $D_A$, $D_B$, $D_C$, $D_D$, and $D_E$ generated during the read operation, the signal and noise characteristics can optionally include the optimized read voltage $V_O$. Further, the memory device 130 can use the optimized read voltage $V_O$ in determining the data 137 from the memory cells at the address 135. Alternatively, the memory device 130 uses the suggested read voltage in the read control parameter 161 in reading the data 137.

The controller 115 can be configured with more processing power than the calibration circuit 145 of the integrated circuit memory device 130. Further, the controller 115 can have other signal and noise characteristics applicable to the memory cells in the group (e.g., 133, . . . , or 133). Thus, in general, the controller 115 can compute a more accurate estimation of the optimized read voltage $V_O$ (e.g., for a subsequent read operation, or for a retry of the read operation).

Optionally, the performance manager 113 of the controller 115 can identify, based on the signal and noise characteristics 139, a program failure in data being programmed in the memory cells of the memory device 130. For example, without the signal and noise characteristics 139, the controller 115 would have to try to decode data 137 retrieved from a page in the memory device 130 and try error handling operations. After failing to recover from errors, the controller 115 can positively identify the program failure in the data 137 received from the memory device 130. However, when the program failure is identified from the signal and noise characteristics 139, the controller 115 can bypass the operations of attempting to decode the data 137 and the operations of error handling. In some instances, the controller 115 may analyze the signature of unrecoverable data 137 to infer program failure. However, the signal and noise characteristics 139 from the memory device 130 can allow positive identification of program failure.

In general, it is not necessary for the calibration circuit 145 to provide the signal and noise characteristics 139 in the form of a distribution of bit counts over a set of read voltages, or in the form of a distribution of count differences over a set of read voltages. For example, the calibration circuit 145 can provide the optimized read voltage $V_O$ calculated by the calibration circuit 145, as signal and noise characteristics 139, which allows the controller 115 of the memory sub-system 110 to observe shifts in the optimized read voltage as a function of one or more factors, such as cross temperature effect, read disturb (RD), program/erase (PE), or data retention (DR), etc. The observe shifts can be used in the controller 115 to build a predictive model of the behavior of the memory cells in the memory device 130 and thus improve the operations of the memory device 130 based on the predictive model. For example, the controller can predict a current optimized read voltage for a read command and instruct the memory device 130 to perform the command to read the data 137 at the address 135 using the read voltage predicted using the predictive model.

The calibration circuit 145 can be configured to generate the signal and noise characteristics 139 (e.g., the bit counts, or bit count differences) as a byproduct of a read operation. The generation of the signal and noise characteristics 139 can be implemented in the integrated circuit memory device 130 with little or no impact on the latency of the read operation in comparison with a typical read without the generation of the signal and noise characteristics 139.

In some embodiments, the signal and noise characteristics 139 generated in one read operation may not be enough for the calibration circuit 145 to identify an optimal read voltage. For example, a bit count C can be determined for one or more read voltages $V_A$, $V_B$, $V_C$, $V_D$, and/or $V_E$ during one read operation. The entire set of bit counts $C_A$, $C_B$, $C_C$, $C_D$, and $C_E$ can be determined from two or more read operations for the same group (e.g., 131 or 133) of memory cells. When the bit count for multiple read voltages is determined in one read operation, the calibration circuit 145 can apply the different read voltages to multiple subgroups in parallel to obtain the bit counts of the subgroups and infer the corresponding counts for the entire group (e.g., 131 or 133) based on the assumption that the data distribution in the subgroups is similar or the same in the entire group (e.g., 131 or 133). The performance manager 113 uses the bit counts $C_A$, $C_B$, $C_C$, $C_D$, and $C_E$ collected over two or more read operations for the same group (e.g., 131 or 133) of memory cells to calculate the optimized read voltage $V_O$ 151. Subsequently, the controller 115 can instruct the memory device 130 to use the optimized read voltage $V_O$ 151 to read data from the group (e.g., 131 or 133) of memory cells.

In some embodiment, in calculating the optimized read voltage $V_O$ 151, the performance manager 113 uses not only the bit counts $C_A$, $C_B$, $C_C$, $C_D$, and $C_E$ collected over one or more read operations for the same group (e.g., 131 or 133) of memory cells, but also information about cross-temperature effect, read disturb (RD), program/erase (PE), or data retention (DR).

Optionally, the performance manager 113 correlates the optimized read voltage $V_O$ 151, determined by the performance manager 113 and/or the calibration circuit 145, with cross-temperature effect, read disturb (RD), program/erase (PE), or data retention (DR) to improve a predictive model of optimized read voltage for an integrated circuit die.

Thus, the calibration circuit 145 can determine signal and noise characteristics 139 efficiently as a byproduct of performing a read operation according to a command from the controller 115 of the memory sub-system 110; and the performance manager 113 of the controller 115 can improve signal processing in the memory sub-system 110 using the signal and noise characteristics 139.

Optionally, the performance manager 113 of the controller 115 can use the signal and noise characteristics 139 provided by the memory device 130 for each read operation of a given page-type to adjust/update the optimized read voltage $V_O$ for the page-type. Furthermore, such an update/adjustment can be performed for each host read and possible no background reads, or reduced background reads.

After a number of leading read operations, each subsequent read operation can generate addition signal and noise characteristics 139 that can be combined with signal and noise characteristics obtained in a number of immediate prior read operations to calculate the updated optimized read voltage $V_O$.

In general, the calculation of the optimized read voltage $V_O$ can be performed within the memory device 130, or by a controller 115 of the memory sub-system 110 that receives the signal and noise characteristics 139 as part of enriched status response from the memory device 130.

Since the signal and noise characteristics 139 is collected with little or no impact on individual read operations, the optimized read voltage $V_O$ can be calibrated over the time continuously to prevent a substantial jump in the optimal voltage. Thus, the overall performance of the memory sub-system 110 over a period of time can be improved.

In general, the signal and noise characteristics 139 obtained by the controller 115 from the memory device 130 is not limited to the tracking of optimized read voltages. For example, the controller 115 can use the relation between the adjustments in optimized read voltages as a function of operating temperature to model the margin loss from cross-temperature effects. Similarly, by observing the amount of retention shift over time, the controller 115 can infer the actual health of the memory cells in the memory device 130, such as the amount of damage the memory cells have suffered from repeated erase/program cycles.

Figure 5:
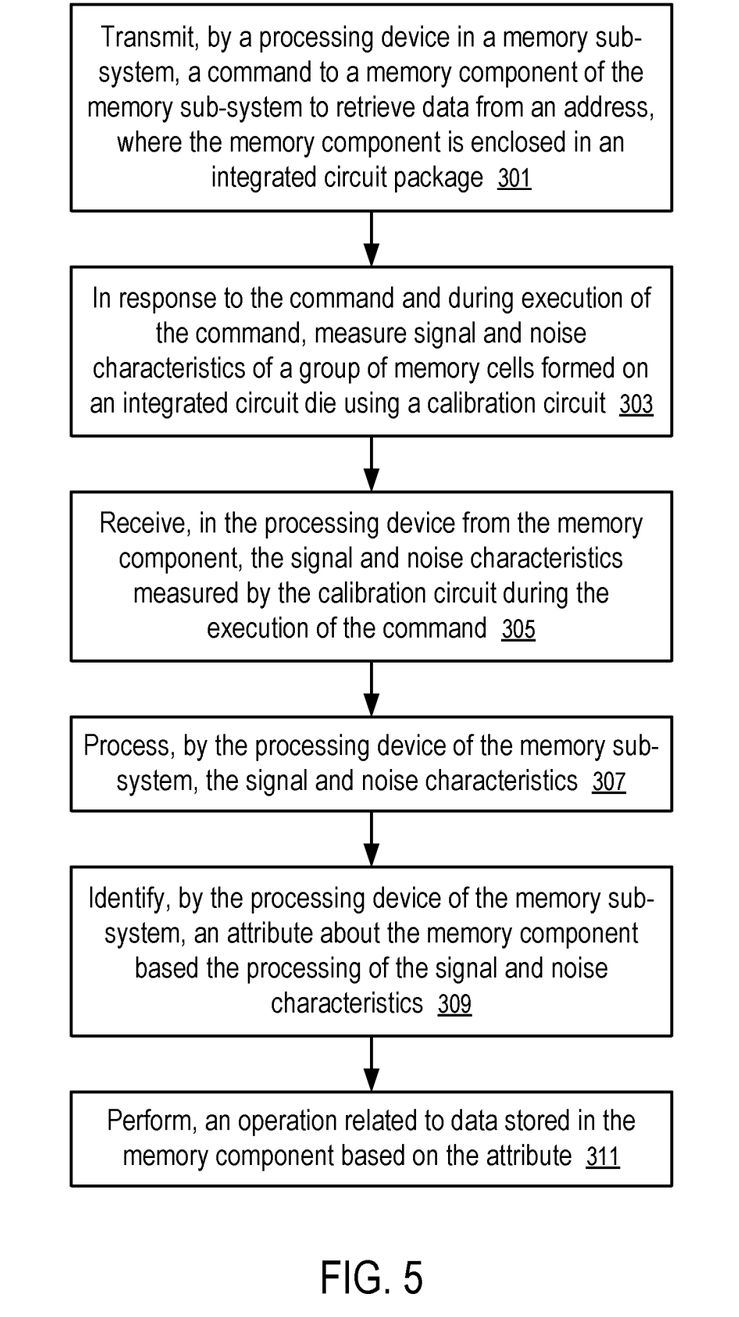
FIG. 5 shows a method of a memory sub-system enhancing memory operations using signal and noise characteristics from a memory device.

FIG. 5 shows a method of a memory sub-system 110 enhancing memory operations using signal and noise characteristics 139 from a memory device 130. The method of FIG. 5 can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method of FIG. 5 is performed at least in part by the controller 115 of FIG. 1, or 4. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 5 can be implemented in a computing system of FIG. 1 with a memory device of FIG. 2 and signal noise characteristics illustrated in FIG. 3 in interactions between a controller and a memory device illustrated in FIG. 4.

At block 301, a processing device 117 in a memory sub-system 110 transmits a command to a memory device (e.g., 130) of the memory sub-system 110 to retrieve data 137 from an address 135.

For example, the memory device 130 is enclosed in an integrated circuit package; and a calibration circuit 145 can be formed at least in part on the integrated circuit die.

At block 303, in response to the command and during the execution of the command, a calibration circuit 145 of the memory device 130 measures signal and noise characteristics 139 of a group (e.g., 131 or 133) of memory cells formed on an integrated circuit die.

At block 305, the processing device 117 receives from the memory device 130 the signal and noise characteristics 139 that are measured by the calibration circuit 145 during the execution of the command.

At block 307, the processing device 117 of the memory sub-system 110 processes the signal and noise characteristics. Alternatively, or in combination, processing logic configured in the memory device 130 can process the signal and noise characteristics.

At block 309, the processing device 117 of the memory sub-system 110 identifies an attribute about the memory device 130 based the processing 307 of the signal and noise characteristics 139.

At block 311, the memory sub-system 110 performs an operation related to data stored in the memory device 130 based on the attribute.

For example, the signal and noise characteristics 139 can include a count (e.g., $V_A$) of memory cells in the group having a predetermined state (e.g., conductive or non-conductive) when a read voltage (e.g., $V_A$) is applied on the group of memory cells.

For example, the signal and noise characteristics 139 can include a difference (e.g., $D_A$) between a first count (e.g., $C_A$) of memory cells in the group having a predetermined state when a first read voltage (e.g., $V_A$) is applied on the group of memory cells and a second count (e.g., $C_B$) of memory cells in the group having the predetermined state when a second read voltage (e.g., $V_B$) is applied on the group of memory cells.

For example, the signal and noise characteristics 139 can include statistic data (e.g., bit counts and/or count differences) of memory cells at varying operating parameters (e.g., read voltages).

For example, the signal and noise characteristics 139 can include a first optimized read voltage $V_O$ calculated by the calibration circuit 145 of the memory device 130; and the attribute can include a second optimized read voltage $V_O$ calculated by the processing device 117 using at least the signal and noise characteristics 139.

For example, the calibration circuit 145 and the processing device 117 can calculate the optimized read voltage $V_O$ using different methods, different data sets, and/or for different conditions to operate the memory device 130.

For example, the first optimized read voltage $V_O$ can be calculated by the calibration circuit 145 using a first method; and the second optimized read voltage $V_O$ can be calculated by the processing device 117 using a second method different from the first method.

For example, the second optimized read voltage $V_O$ is calculated based on information not available in the memory device 130 during the execution of the command in the memory device 130, such as further signal and noise characteristics generated by the calibration circuit 145 during the execution of one or more prior commands.

In some embodiments, the signal and noise characteristics 139 measured during the execution of the command in the memory device 130 may not be enough for the memory device 130 to calculate the first optimized read voltage $V_O$; and the processing device 117 can use accumulated signal and noise characteristics 139 measured during the execution of multiple commands in the memory device 130 to calculate the second optimized read voltage $V_O$. In other embodiments, the memory device 130 is also capable of accumulating signal and noise characteristics 139 measured during the execution of multiple commands in the memory device 130 to calculate the first optimized read voltage $V_O$.

For example, the processing device 117 can use information not available in the memory device during the execution of the command to calculate second optimized read voltage $V_O$. Such information can include data relevant to charge loss, read disturb, cross-temperature effect, data retention, or program/erase, or any combination thereof.

For example, the attribute identified based at least in part on the signal and noise characteristics 139 can include a predictive model. For example, the predictive model can be obtained by observing the change of the optimized read voltage $V_O$ as a function of one or more factors, such as cross-temperature effect, read disturb, program/erase, or data retention, or any combination thereof.

For example, the attribute identified based at least in part on the signal and noise characteristics 139 can include a determination of program failure in the data 137 that is retrieved by the memory device 130 from the address in response to the command; and the operation performed 311 based on the attribute can include skipping decoding the data, and/or skipping recovering from errors in the data 137.

For example, the attribute identified based at least in part on the signal and noise characteristics 139 can include a predictive model of an optimized read voltage as a function of one or more factors.

In general, the signal and noise characteristics 139 can include statistics of memory cells in the group (e.g., 131 or 133) operated at different levels of a parameter for reading the memory cells.

In another example, the attribute identified based at least in part on the signal and noise characteristics 139 can include an indication of an amount of damage the memory device 130 has as a result of repeated program/erase cycles.

In a further example, the attribute identified based at least in part on the signal and noise characteristics 139 can include an indication of margin loss from cross-temperature effect based on tracking shifting of optimized read voltage as a function of operating temperature.

In yet another example, the attribute identified based at least in part on the signal and noise characteristics 139 can include an estimate of the bit error rate of the data 137 retrieved from the memory cells. The data 137 can be in an encoded form that allows error detection and/or recovery via Error Correction Code (ECC), Low-Density Parity-Check (LDPC) code, etc. If the estimate of the bit error rate indicates that the data 137 will fail to decode, the memory sub-system 110 can skip the attempt to decode the data 137, skip transmitting the data 137 to a decoder, skip transmitting the data 137 from the memory device 130 to the controller 115, and/or skip reading the data 137 from memory cells using the currently known read voltage(s).

The performance manager 113 can include instructions configured as software and/or firmware. For example, the processing device 117 can execute the instructions of the performance manager 113 to perform the above discussed methods. Further, some or all the operations of the performance manager 113 discussed above can be implemented via processing logic configured within the memory device 130 (e.g., to reduce the data communication between the memory device 130 and the controller 115 of the memory sub-system 110). For example, the processing logic can be implemented using Complementary metal-oxide-semiconductor (CMOS) circuitry formed under the array of memory cells on an integrated circuit die of the memory device 130. For example, the processing logic can be formed, within the integrated circuit package of the memory device 130, on a separate integrated circuit die that is connected to the integrated circuit die having the memory cells using Through-Silicon Vias (TSVs) and/or other connection techniques.

A non-transitory computer storage medium can be used to store instructions of the firmware of a memory sub-system (e.g., 110). When the instructions are executed by the controller 115 and/or the processing device 117, the instructions cause the controller 115 and/or the processing device 117 to perform the methods discussed above.

Figure 6:
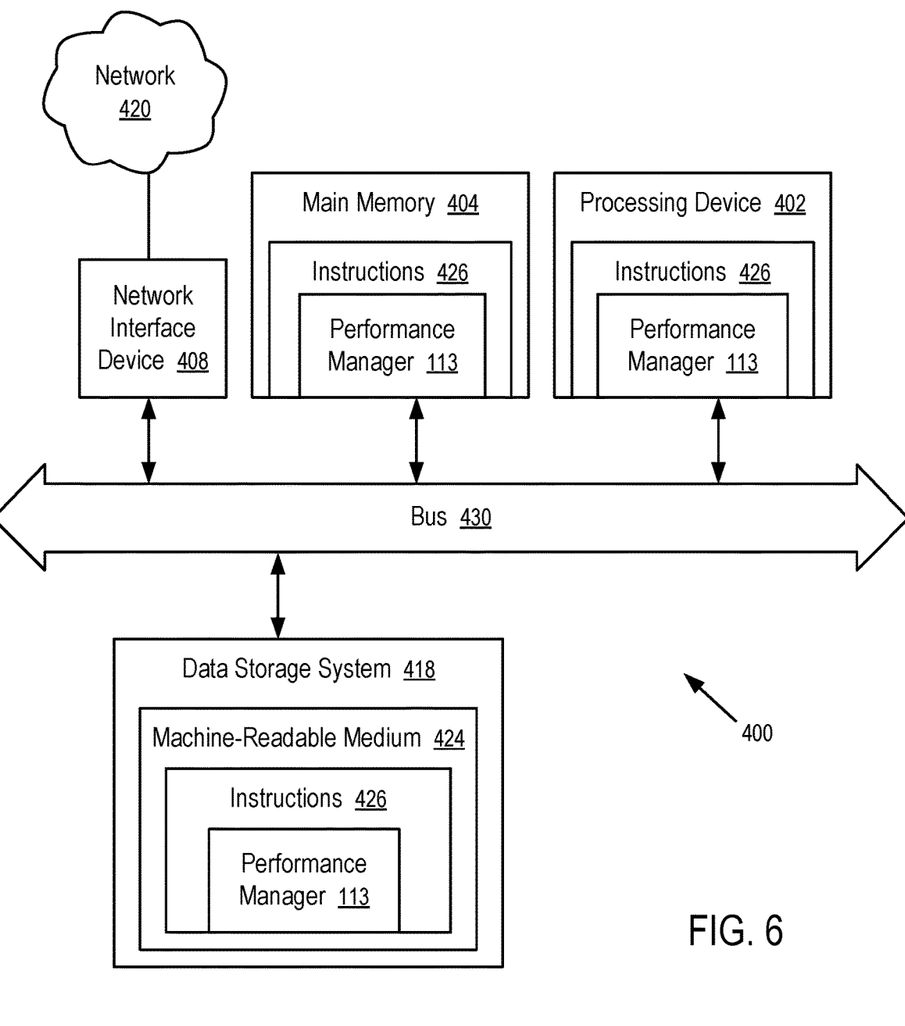
FIG. 6 is a block diagram of an example computer system in which embodiments of the present disclosure can operate.

FIG. 6 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a performance manager 113 (e.g., to execute instructions to perform operations corresponding to the performance manager 113 described with reference to FIGS. 1-5). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 418, which communicate with each other via a bus 430 (which can include multiple buses).

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to a performance manager 113 (e.g., the performance manager 113 described with reference to FIGS. 1-5). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory sub-system, comprising:
a processing device; and
at least one memory component, the memory component being enclosed in an integrated circuit package, the memory component having:
a group of memory cells formed on an integrated circuit die; and
a calibration circuit;
wherein the processing device is configured to transmit a command to the memory component to retrieve data from an address;
wherein in response to the command and during execution of the command, the calibration circuit is configured to measure signal and noise characteristics of the group of memory cells;
wherein the memory component is configured to, in response to the command:
retrieve the data using a read voltage calibrated using the signal and noise characteristics; and
provide, as a response to the command, the data and the signal and noise characteristics to the processing device, wherein the signal and noise characteristics include measurements of a quantity at a plurality of voltages in vicinity of the read voltage; and
wherein the processing device is configured to process the signal and noise characteristics having the measurements of the quantity at the plurality of voltages to identify an attribute about the memory component and perform an operation related to data stored in the memory component based on the attribute.

2. The memory sub-system of claim 1, wherein the calibration circuit is formed at least in part on the integrated circuit die.

3. The memory sub-system of claim 1, wherein the signal and noise characteristics include a count of memory cells in the group having a predetermined state when a read voltage is applied on the group of memory cells.

4. The memory sub-system of claim 1, wherein the signal and noise characteristics include a difference between:
a first count of memory cells in the group having a predetermined state when a first read voltage is applied on the group of memory cells; and
a second count of memory cells in the group having the predetermined state when a second read voltage is applied on the group of memory cells.

5. The memory sub-system of claim 1, wherein the signal and noise characteristics include statistic data of memory cells at varying operating parameters.

6. The memory sub-system of claim 5, wherein the varying operating parameters includes different voltages applied to read memory cells in the group.

7. The memory sub-system of claim 1, wherein the memory component is configured to further provide a first optimized read voltage calculated by the calibration circuit of the memory component from the signal and noise characteristics; and the attribute includes a second optimized read voltage calculated by the processing device using at least the signal and noise characteristics.

8. The memory sub-system of claim 7, wherein the first optimized read voltage is calculated using a first method; and the second optimized read voltage is calculated using a second method.

9. The memory sub-system of claim 8, wherein the second optimized read voltage is calculated based on information not available in the memory component during the execution of the command.

10. The memory sub-system of claim 9, wherein the information not available in the memory component during the execution of the command includes further signal and noise characteristics generated by the calibration circuit during execution of one or more prior commands.

11. The memory sub-system of claim 9, wherein the information not available in the memory component during the execution of the command includes data relevant to charge loss, read disturb, cross-temperature effect, data retention, or program/erase, or any combination thereof.

12. The memory sub-system of claim 1, wherein the attribute includes a predictive model generated based on the signal and noise characteristics.

13. A method, comprising:
transmitting, by a processing device in a memory sub-system, a command to a memory component of the memory sub-system to retrieve data from an address, the memory component being enclosed in an integrated circuit package and configured to, in response to the command and during execution of the command, measure signal and noise characteristics of a group of memory cells formed on an integrated circuit die using a calibration circuit;
receiving, in the processing device from the memory component, the signal and noise characteristics measured by the calibration circuit during the execution of the command, the signal and noise characteristics including a plurality of measurements of a quantity at a plurality of voltages;
processing, by the processing device of the memory sub-system, the signal and noise characteristics having the plurality of measurements of the quantity at the plurality of voltages;
identifying, by the processing device of the memory sub-system, an attribute about the memory component based on the processing of the signal and noise characteristics; and
performing, an operation related to data stored in the memory component based on the attribute.

14. The method of claim 13, wherein the attribute includes a determination of program failure in the data retrieved by the memory component from the address in response to the command; and the operation includes skipping decoding the data, or skipping recovering from errors in the data.

15. The method of claim 14, wherein the attribute includes a predictive model of an optimized read voltage as a function of one or more factors.

16. The method of claim 15, wherein the signal and noise characteristics include statistics of memory cells in the group operated at different levels of an operating parameter.

17. A non-transitory computer storage medium storing instructions which, when executed by a computing system, cause the computing system to perform a method, the method comprising:
transmitting, by a processing device in a memory sub-system, a command to a memory component of the memory sub-system, the command instructing the memory component to retrieve data from an address, wherein the memory component is enclosed in an integrated circuit package and is configured to, in response to the command and during execution of the command, measure signal and noise characteristics of a group of memory cells formed on an integrated circuit die using a calibration circuit;

receiving, in the processing device from the memory component, the signal and noise characteristics measured by the calibration circuit during the execution of the command, the signal and noise characteristics including a plurality of measurements of a quantity at a plurality of voltages;

processing, by the processing device of the memory sub-system, the signal and noise characteristics having the plurality of measurements of the quantity at the plurality of voltages;

identifying, by the processing device of the memory sub-system, an attribute about the memory component based the processing of the signal and noise characteristics; and performing, an operation related to data stored in the memory component based on the attribute.

18. The non-transitory computer storage medium of claim 17, wherein the attribute includes a predictive model generated based on the signal and noise characteristics and at least one factor, including cross-temperature effect, read disturb, program/erase, or data retention, or any combination thereof.

19. The non-transitory computer storage medium of claim 17, wherein the attribute identifies an amount of damage the memory component has as a result of program/erase cycles.

20. The non-transitory computer storage medium of claim 17, wherein the attribute identifies margin loss from cross-temperature effect based on tracking shifting of optimized read voltage as a function of operating temperature.

* * * * *